United States Patent
Liu et al.

(10) Patent No.: US 8,497,511 B2
(45) Date of Patent: Jul. 30, 2013

(54) ARRAY SUBSTRATE AND DISPLAY APPARATUS USING THE SAME

(75) Inventors: Chuan-Feng Liu, Hsinchu (TW); Chi-Ming Wu, Hsinchu (TW); Chia-Jen Chang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 13/402,997

(22) Filed: Feb. 23, 2012

(65) Prior Publication Data

US 2013/0075728 A1 Mar. 28, 2013

(30) Foreign Application Priority Data

Sep. 28, 2011 (TW) .............................. 100135051 A

(51) Int. Cl.

| H01L 29/04 | (2006.01) |
| --- | --- |
| H01L 29/15 | (2006.01) |
| H01L 31/036 | (2006.01) |
| H01L 29/10 | (2006.01) |
| H01L 31/0376 | (2006.01) |
| H01L 31/20 | (2006.01) |
| H01L 29/76 | (2006.01) |
| H01L 31/112 | (2006.01) |
| H01L 31/062 | (2012.01) |
| H01L 31/113 | (2006.01) |

(52) U.S. Cl.
USPC .................. 257/72; 257/57; 257/59; 257/66; 257/291; 257/E29.126; 257/E29.137; 257/E29.151; 257/E29.202; 257/E29.273

(58) Field of Classification Search
USPC .................. 257/57, 59, 66, 72, 291, E29.126, 257/E29.137, E29.151, E29.202, E29.273
See application file for complete search history.

(56) References Cited

U.S. PATENT DOCUMENTS

| 7,235,813 | B2 * | 6/2007 | Lai ................................. 257/66 |
| 7,445,970 | B2 * | 11/2008 | Lai ................................. 438/149 |
| 7,525,125 | B2 * | 4/2009 | Ahn et al. ........................ 257/89 |
| 7,662,675 | B2 * | 2/2010 | Kim et al. ...................... 438/149 |
| 7,671,931 | B2 * | 3/2010 | Jang et al. ....................... 349/46 |
| 7,709,850 | B2 * | 5/2010 | Wang ............................. 257/98 |
| 8,071,978 | B2 * | 12/2011 | Park et al. ....................... 257/59 |
| 8,242,507 | B2 * | 8/2012 | Chang ............................. 257/72 |
| 2009/0224246 | A1 * | 9/2009 | Hwang et al. ................... 257/59 |
| 2009/0224292 | A1 * | 9/2009 | Asano et al. ................... 257/288 |
| 2010/0038714 | A1 * | 2/2010 | Wu et al. ........................ 257/347 |
| 2010/0163862 | A1 * | 7/2010 | Yang et al. ...................... 257/43 |
| 2013/0048972 | A1 * | 2/2013 | Matsubara ...................... 257/40 |

* cited by examiner

*Primary Examiner* — Ida M Soward

(74) *Attorney, Agent, or Firm* — WPAT, PC; Justin King

(57) ABSTRACT

An array substrate includes scan lines and data lines defining pixel structures. Each pixel structure includes a first TFT, a second TFT and a pixel electrode. The first TFT includes a first gate connected to the scan line, a first source disposed above and partially overlapping the first gate, and a first drain disposed above the first gate. An end of the first source is connected to the data line. The first drain has at least one first concavity in which the first source is disposed partially. The second TFT includes a second gate connected to the scan line, a second source disposed above the second gate and connected to the first drain, and a second drain disposed above and partially overlapping the second gate. The second source has at least one second concavity in which the second drain is disposed partially. The pixel electrode connects to the second drain.

14 Claims, 6 Drawing Sheets

ARRAY SUBSTRATE AND DISPLAY APPARATUS USING THE SAME

TECHNICAL FIELD

The present invention relates to a display apparatus, and more particularly to a pixel structure of a display apparatus.

BACKGROUND

To prevent leakage, in a common electronic-paper (E-paper) display apparatus, each of the pixel structures on a thin film transistor (TFT) array substrate commonly includes two series-coupled TFTs.

FIG. 1 is a schematic view of a conventional pixel structure including two series-connected TFTs. As shown in FIG. 1, the pixel structure includes a first TFT 110 and a second TFT 120 connected in series. The first TFT 110 includes a first gate 112, a first source 114, a first drain 116 and a first semiconductor pattern 118, and the first gate 112, the first source 114, the first drain 116 and the first semiconductor pattern 118 respectively have a rectangular shape. Specifically, the first source 114 and the first drain 116 respectively partially overlap the first gate 112, the first semiconductor pattern 118 is disposed above the first gate 112, and two partial areas of the first semiconductor pattern 118 respectively are covered by the first source 114 and the first drain 116.

The second TFT 120 includes a second gate 122, a second source 124, a second drain 126 and a second semiconductor pattern 128, and the second gate 122, the second source 124, the second drain 126 and the second semiconductor pattern 128 respectively have a rectangular shape. Specifically, the second source 124 and the second drain 126 respectively partially overlap the second gate 122, the second semiconductor pattern 128 is disposed above the second gate 122, and two partial areas of the second semiconductor pattern 128 respectively are covered by the second source 124 and the second drain 126. In addition, the first drain 116 is connected to the second source 124, and the first drain 116 and the second source 124 cooperatively form a rectangular electrode.

However, the overlapping area between the first source 114 and the first gate 112, as well as between the second drain 126 and the second gate 122, may result in stray capacitance, and the stray capacitance may consequently lead the pixel structure to consume more power, so it is quite necessary to reduce the stray capacitance in the pixel structure. However, because the channel between the first source 114 and the first gate 112, as well as between the second source 124 and the second gate 122, has to be maintained at a proper width of W and a proper length of L, the areas of the first source 114, the first drain 116, the second source 124 and the second drain 126 cannot be effectively decreased without any limit. As a result, the overlapping area between the first source 114 and the first gate 112 and the overlapping area between the second source 124 and the second gate 122 cannot be effectively decreased, and thus the stray capacitance is still high.

SUMMARY OF EMBODIMENTS

An embodiment of the present invention provides an array substrate, which includes a substrate, a plurality of scan lines and a plurality of data lines. The scan lines are disposed on the substrate in a first direction, the data lines are disposed on the substrate in a second direction, the data lines are electrically insulated and intersected with the scan lines thereby defining a plurality of pixel structures, and the first and second directions are mutually perpendicular. Each pixel structure includes a first thin film transistor, a second thin film transistor and a pixel electrode. The first thin film transistor includes a first gate, a first source and a first drain. The first gate is connected to the corresponding scan line. The first source is disposed above the first gate and partially overlaps the first gate. One end of the first source is connected to the corresponding data line. The first drain is disposed above the first gate and includes at least one first concavity, and a portion of the first source is disposed in the at least one first concavity. The second thin film transistor includes a second gate, a second source and a second drain. The second gate is connected to the corresponding scan line. The second source is disposed above the second gate and connected to the first drain. The second source includes at least one second concavity. The second drain is disposed above the second gate and partially overlaps the second gate, and a portion of the second drain is disposed in the at least one second concavity. The pixel electrode is connected to the second drain.

An embodiment of the present invention further provides a display apparatus, which includes any one of the aforementioned array substrates, an opposite substrate and a display layer. The opposite substrate is disposed opposite to the array substrate. The display layer is disposed between the array substrate and the opposite substrate.

In summary, compared with the conventional technology, in embodiments of the present invention, a portion of the first source is disposed in the first concavity of the first drain and a portion of the second drain is disposed in the second concavity of the second source, so the pixel structure of the embodiments of the present invention can have smaller overlapping areas between the first source and the first gate and between the second drain and the second gate on a condition that channels of the pixel structures of the embodiments of the present invention and the conventional technology have a same width to length ratio. Therefore, the stray capacitances between the first source and the first gate and between the second drain and the second gate are accordingly decreased, thereby reducing the power consumption of the pixel structure of the present invention. So, the array substrate and the display apparatus of the present invention consume less power.

BRIEF DESCRIPTION OF THE DRAWINGS

The above embodiments will become more readily apparent to those ordinarily skilled in the art after reviewing the following detailed description and accompanying drawings, in which.

DETAILED DESCRIPTION OF PREFERRED EMBODIMENTS

The disclosure will now be described more specifically with reference to the following embodiments. It is to be noted that the following descriptions of preferred embodiments are presented herein for purpose of illustration and description only. It is not intended to be exhaustive or to be limited to the precise form disclosed.

Figure 2:
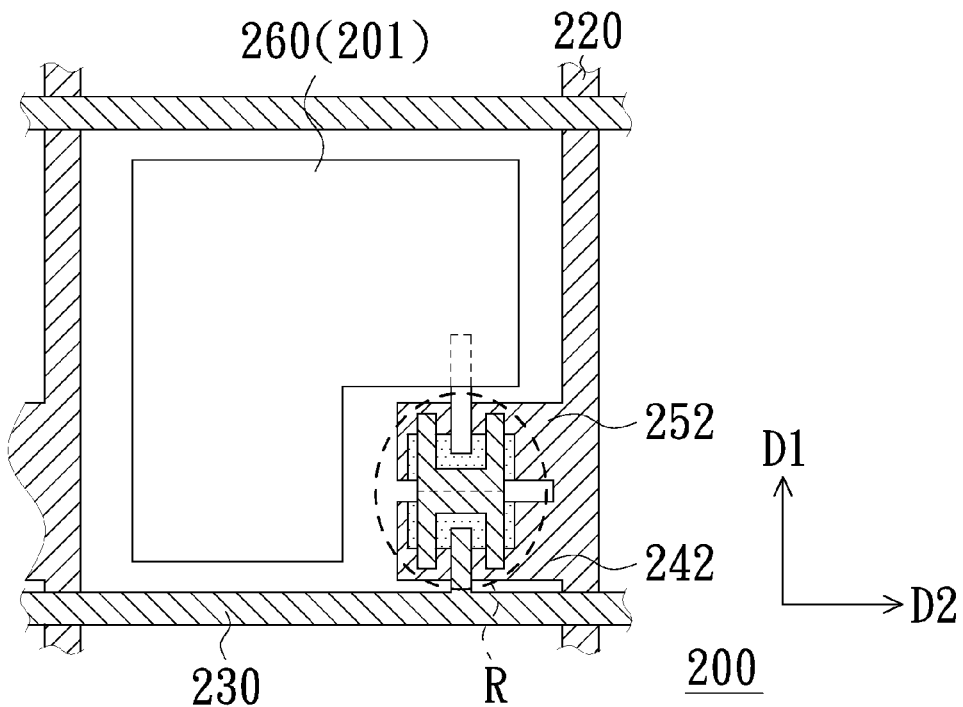
FIG. 2 is a schematic view of an array substrate in accordance with an embodiment of the present invention.
Figure 3:
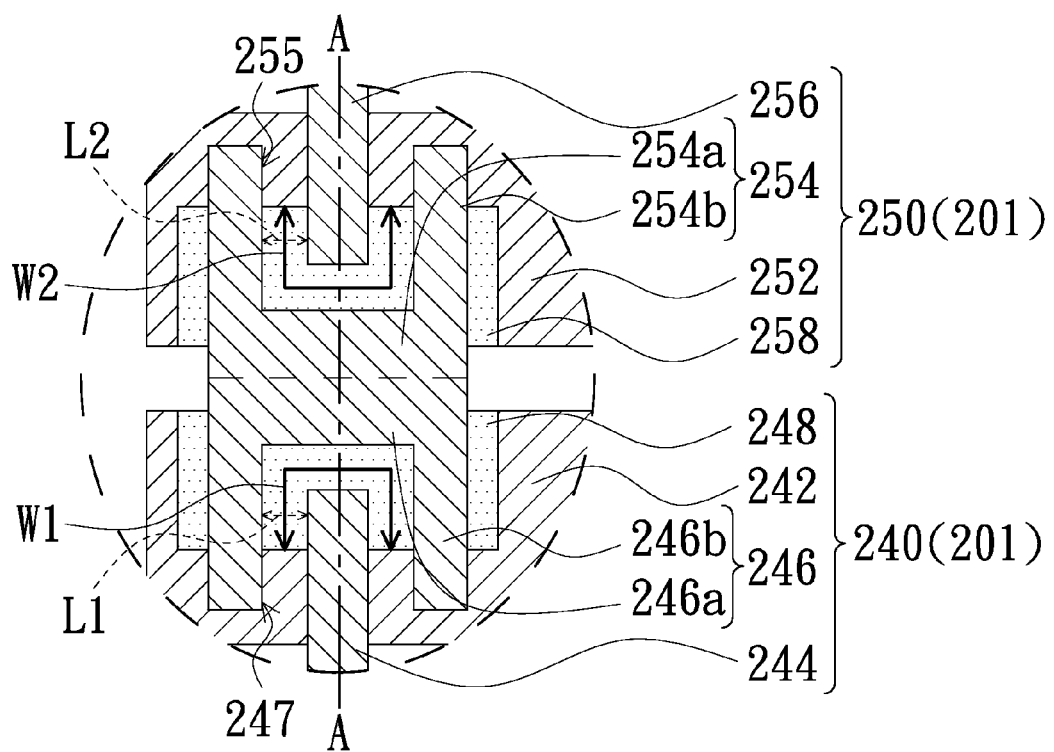
FIG. 3 is an enlarged view of an area R in FIG. 2.
Figure 4:
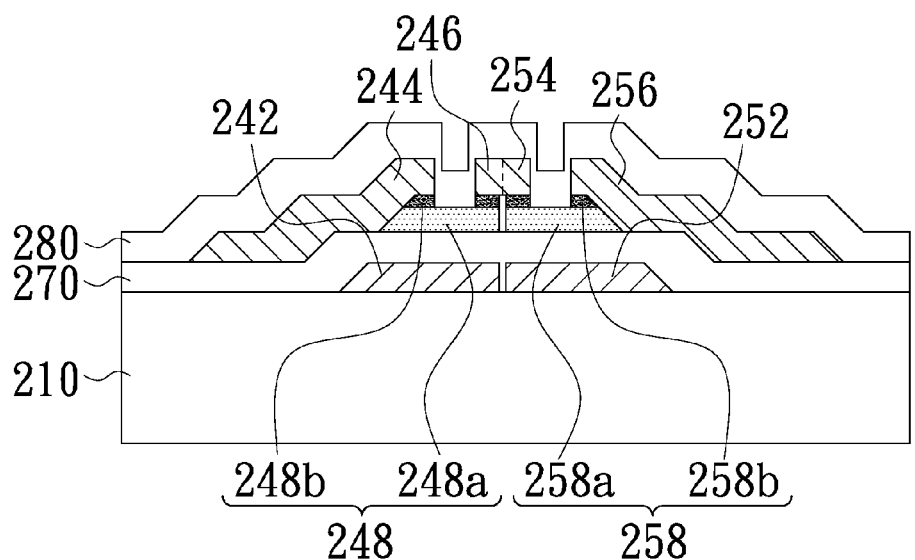
FIG. 4 is a schematic cross-sectional view taken along line A-A in FIG. 3.

FIG. 2 is a schematic view of an array substrate in accordance with an embodiment of the present invention. FIG. 3 is an enlarged view of an area R in FIG. 2. FIG. 4 is a schematic cross-sectional view taken along line A-A in FIG. 3. As shown in FIGS. 2, 3 and 4, the array substrate 200 in the present embodiment includes a substrate 210, a plurality of scan lines 220 and a plurality of data lines 230. The scan lines 220 are disposed on the substrate 210 in a first direction D1, the data lines 230 are disposed on the substrate 210 in a second direction D2, and the first direction D1 and the second direction D2 are mutually perpendicular. The scan lines 220 and the data lines 230 are electrically insulated and intersected with each other thereby defining a plurality of pixel structures 201, and each of the pixel structures 201 includes a first thin film transistor (TFT) 240, a second TFT 250 and a pixel electrode 260.

The first TFT 240 includes a first gate 242, a first source 244 and a first drain 246. The first gate 242 for example has a rectangular shape and is connected to the corresponding scan line 220; however, the shape of the first gate 242 is not limited as such. The first source 244 is disposed above the first gate 242 and partially overlaps the first gate 242. The first source 244 for example is a strip-shaped electrode and one end of which is connected to the data line 230, and this end connected to the data line 230 for example is the end that not overlaps the first gate 242. The first drain 246 is disposed above the first gate 242 and has a first concavity 247 in which a portion of the first source 244 is disposed. Specifically, the entire first drain 246 for example is disposed right above the first gate 242 and includes a first connecting segment 246a and two opposite first extending segments 246b, which respectively extend from the two ends of the first connecting segment 246a. The first concavity 247 for example is formed between the first connecting segment 246a and the two first extending segments 246b.

The second TFT 250 includes a second gate 252, a second source 254 and a second drain 256. The second gate 252 for example has a rectangular shape and is connected to the scan line 220; however, the shape of the second gate 252 is not limited as such. The second source 254 is disposed above the second gate 252 and connected to the first drain 246. The second source 254 has a second concavity 255. Specifically, the entire second source 254 for example is disposed right above the second gate 252 and includes a second connecting segment 254a and two opposite second extending segments 254b, which respectively extend from the two ends of the second connecting segment 254a. The second concavity 255 for example is formed between the second connecting segment 254a and the two second extending segments 254b. The first connecting segment 246a of the drain 246 is connected to the second connecting segment 254a of the second source 254, and the first drain 246 and the second source 254 are connected with each other to form an H-shaped electrode. In addition, an opening of the first concavity 247 and an opening of the second concavity 255 for example face to opposite directions. In addition, the second drain 256 is disposed above the second gate 252 and partially overlaps the second gate 252, and a portion of the second drain 256 is disposed in the second concavity 255. The second drain 256 for example is a strip-shaped electrode and is connected to the pixel electrode 260.

In the present embodiment, a gap for example is formed between the first gate 242 and the second gate 252; however, the first gate 242 and the second gate 252 may be connected to each other in another embodiment. In addition, the data line 230, the first source 244, the first drain 246, the second source 254 and the second drain 256 for example belong to a same metal layer; and the scan line 220, the first gate 242 and the second gate 252 for example belong to another metal layer.

The array substrate 200 in the present embodiment for example further includes a first insulation layer 270 and a second insulation layer 280. The first insulation layer 270 is disposed on the substrate 210 to cover the scan line 220, the first gate 242 and the second gate 252. The second insulation layer 280 is disposed to cover the data line 230, the first source 244, the first drain 246, the second source 254, the second drain 256 and the pixel electrode 260. In addition, the first TFT 240 further includes a first semiconductor pattern 248, which is disposed on the first insulation layer 270 and partially overlaps the first gate 242. Each of the first source 244 and the first drain 246 covers a portion of the first semiconductor pattern 248. The first semiconductor pattern 248 for example includes a semiconductor material layer 248a and an ohmic contact layer 248b. The ohmic contact layer 248b is disposed on the semiconductor material layer 248a and includes two separating patterns, which respectively are covered by the first source 244 and the first drain 246. In addition, the second TFT 250 further includes a second semiconductor pattern 258, which is disposed on the first insulation layer 270 and partially overlaps the second gate 252. Each of the second source 254 and the second drain 256 covers a portion of the second semiconductor pattern 258. The second semiconductor pattern 258 for example includes a semiconductor material layer 258a and an ohmic contact layer 258b. The ohmic contact layer 258b is disposed on the semiconductor material layer 258a and includes two separating patterns, which respectively are covered by the second source 254 and the second drain 256. In the present embodiment, a gap for example is formed between the first semiconductor pattern 248 and the second semiconductor pattern 258; however, the first semiconductor pattern 248 and the second semiconductor pattern 258 may be connected to each other in another embodiment.

Figure 5:
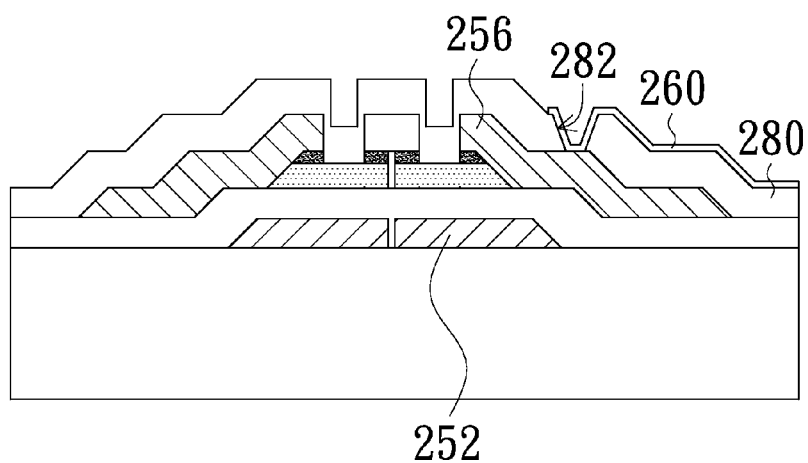
FIG. 5 is a schematic partial cross-sectional view of the array substrate in FIG. 2.

FIG. 5 is a schematic partial cross-sectional view of the array substrate in FIG. 2. As shown in FIG. 5, the pixel electrode 260 in the present embodiment is connected to a part of the second drain 256 not overlapping the second gate 252. Specifically, the pixel electrode 260 for example is disposed on the second insulation layer 280 and is connected to the second drain 256 through an opening 282 of the second insulation layer 280. In addition, the pixel electrode 260 for example is a metal electrode or a transparent electrode.

Figure 1:
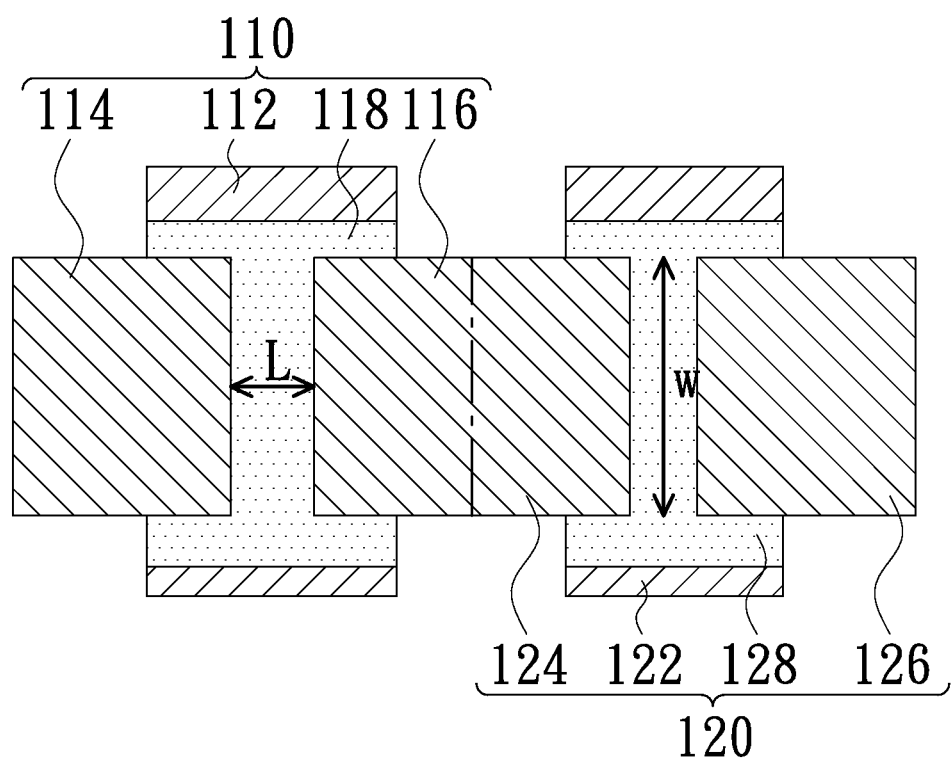
FIG. 1 is a schematic view of a conventional pixel structure including two series-connected TFTs.

Please refer back to FIG. 3. Because a portion of the first source 244 is disposed in the first concavity 247 of the first drain 246 and a portion of the second drain 256 is disposed in the second concavity 255 of the second source 254, the first source 244 and the second drain 256 respectively are partially enclosed by the first drain 246 and the second source 254. As a result, the channel widths W1, W2, respectively formed between the first source 244 and the first drain 246 and between the second source 254 and the second drain 256, can have an increased value. Therefore, on condition that the channel widths W1, W2 have a value equal to the channel width W (shown in FIG. 1) has and the channel lengths L1, L2 have a value equal to the channel length L (shown in FIG. 1) has, compared with the conventional technology, in the pixel structure 201 of the present embodiment, the overlapping area between the first source 244 and the first drain 242 and the overlapping area between the second gate 252 and the second drain 256 can be decreased. As a result, the stray capacitances resulted between the first source 244 and the first drain 242, as well as between the second drain 256 and the second gate 252, are decreased, so the pixel structure 201 can have a less power consumption and the array substrate 200 consumes less power consequently.

It is to be noted that, the shapes of the first source 244, the first drain 246, the second source 254 and the second drain 256, as well as the entire shape of the first drain 246 and the second source 254 after being connected, described above are used as an example, the present invention is not limited to this manner.

Figure 6:
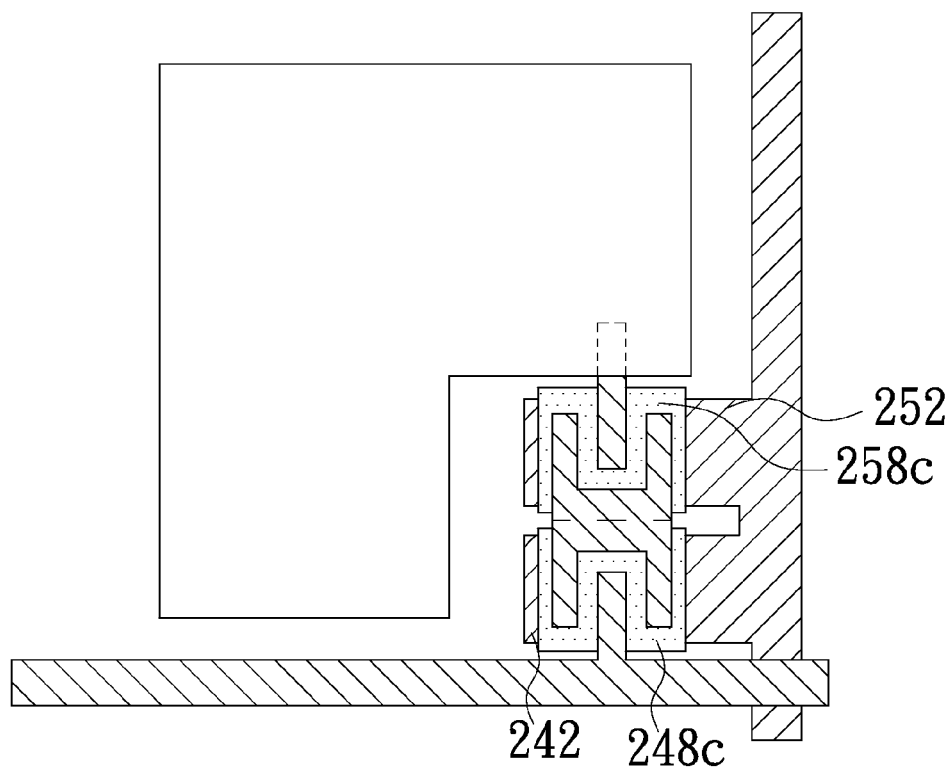
FIG. 6 is a schematic view of a pixel structure of an array substrate in accordance with another embodiment of the present invention.

Besides, in another embodiment as illustrated in FIG. 6, a portion of the first semiconductor pattern 248c may extend outside the first gate 242, and thereby this portion does not overlap the first gate 242. Similarly, a portion of the second semiconductor pattern 258c may extend outside the second gate 252, and thereby this portion does not overlap the second gate 252. Based on the aforementioned structure, the leakage of the pixel structure can be further reduced.

In addition, in other embodiments of the present invention, the first drain may have one or more than one first concavity and the second source may have one or more than one second concavity, and the number of the first concavity needs not be necessarily equal to that of the second concavity. In addition, the number of the strip-shaped electrode of the first source may correspond to the number of the first concavity; and the number of the strip-shaped electrode of the second drain may correspond to the number of the second concavity. An embodiment of having different numbers of the first concavity and the second concavity and an embodiment of having more than one first concavity and more than one second concavity will be described in the following with a reference of figures; however, it is to be understood that the disclosure needs not be limited to the disclosed embodiments.

Figure 7:
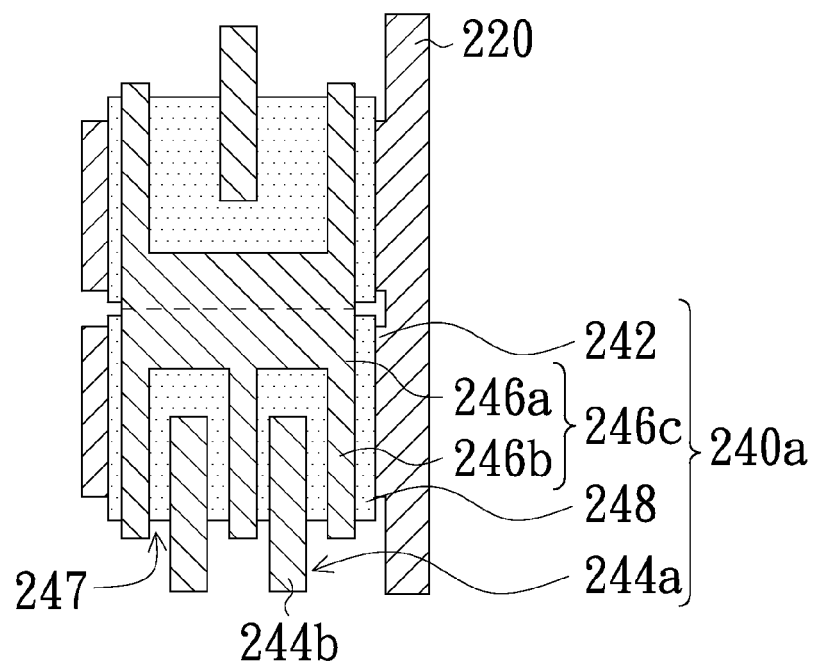
FIG. 7 is a schematic partial view of a pixel structure of an array substrate in accordance with another embodiment of the present invention.

FIG. 7 is a schematic partial view of a pixel structure of an array substrate in accordance with another embodiment of the present invention. As shown in FIG. 7, the array substrate in the present embodiment differs from the array substrate in FIG. 2 on the first TFT. In particular, the first drain 246c of the first TFT 240a in the present embodiment includes more than one first concavity 247; it is to be noted that the FIG. 7 is exemplified by having two first concavities 247. Moreover, the first drain 246c for example includes three first extending segments 246b, and the aforementioned two first concavities 247 are formed between these three first extending segments 246b and the first connecting segment 246a. In addition, the first source 244a for example includes a plurality of strip-shaped electrodes 244b and the number of the strip-shaped electrode 244b for example is corresponding to the number of the first concavity 247. Therefore, the two strip-shaped electrodes 244b are disposed in the two first concavities 247 with one to one correspondence.

Figure 8:
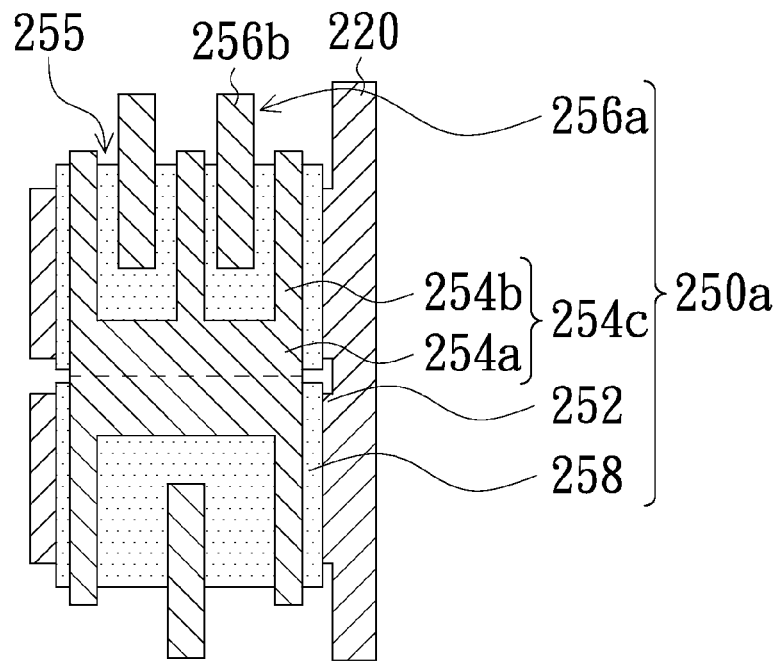
FIG. 8 is a schematic partial view of a pixel structure of an array substrate in accordance with another embodiment of the present invention.

FIG. 8 is a schematic partial view of a pixel structure of an array substrate in accordance with another embodiment of the present invention. As shown in FIG. 8, the array substrate in the present embodiment differs from the array substrate in FIG. 2 on the second TFT. In particular, the second drain 254c of the second TFT 250a in the present embodiment includes more than one second concavity 255; it is to be noted that the FIG. 8 is exemplified by having two second concavities 255. Moreover, the second source 254c for example includes three second extending segments 254b, and the aforementioned two second concavities 255 are formed between these three second extending segments 254b and the second connecting segment 254a. In addition, the second drain 256a for example includes a plurality of strip-shaped electrodes 256b and the number of the strip-shaped electrode 256b for example is corresponding to the number of the second concavity 255. Therefore, the two strip-shaped electrodes 256b are disposed in the two second concavities 255 with one to one correspondence.

Figure 9:
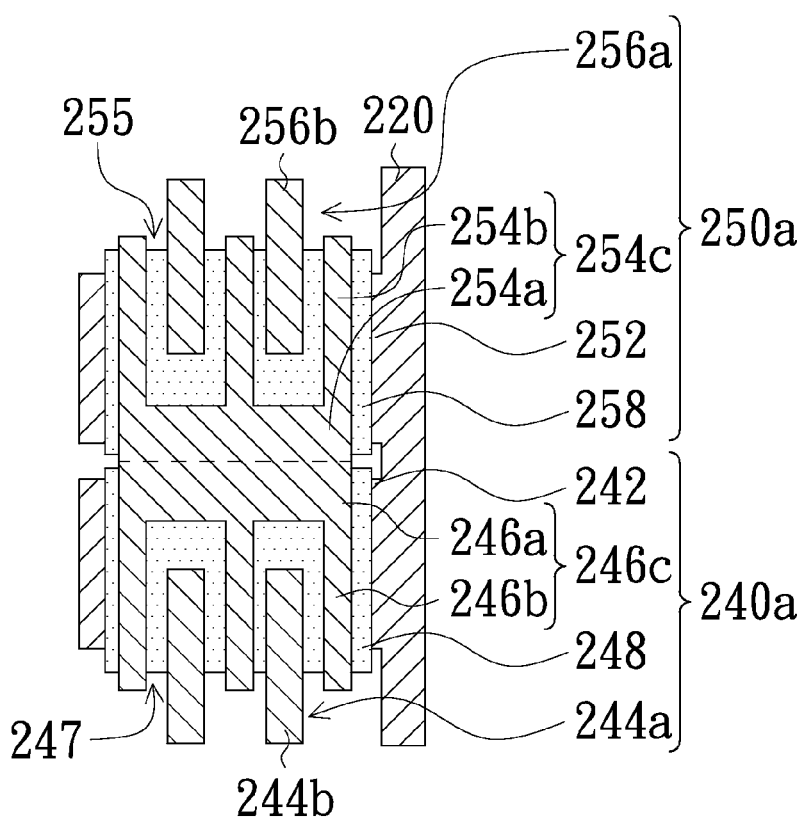
FIG. 9 is a schematic partial view of a pixel structure of an array substrate in accordance with another embodiment of the present invention.

FIG. 9 is a schematic partial view of a pixel structure of an array substrate in accordance with another embodiment of the present invention. As shown in FIG. 9, the array substrate in the present embodiment differs from the array substrate in FIG. 2 on that in the present embodiment the first TFT 240a and the second TFT 250a respectively include more than one first concavity 247 and more than one second concavity 255. Besides, the first source 244a includes more than one strip-shaped electrode 244b, and the strip-shaped electrodes 244b are disposed in the first concavities 247 with one to one correspondence; and the second drain 256a includes more than one strip-shaped electrode 256b, and the strip-shaped electrodes 256b are disposed in the second concavities 255 with one to one correspondence. It is to be noted that in the present embodiment of having more than one first concavity 247 and more than one second concavity 255, the number of the first concavity 247 needs not be necessarily equal to the number of the second concavity 255.

Figure 10:
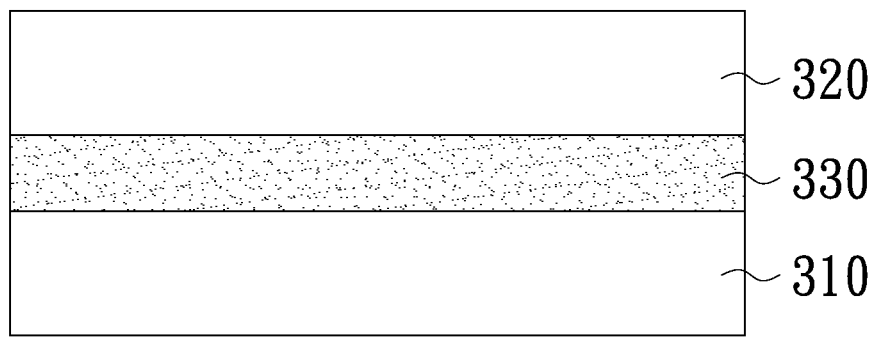
FIG. 10 is a schematic view of a display apparatus in accordance with an embodiment of the present invention.

FIG. 10 is a schematic view of a display apparatus in accordance with an embodiment of the present invention. As shown in FIG. 10, the display apparatus 300 of the present embodiment includes an array substrate 310, an opposite substrate 320 disposed opposite to the array substrate 310, and a display layer 330 disposed between the array substrate 310 and the opposite substrate 320. Specifically, the array substrate 310 can be any one of the array substrate selected in the aforementioned embodiments; the display layer 330 can be a liquid crystal display layer or an electrophoretic display layer. It is noted that the display apparatus 300 of the present embodiment may further include a light emitting module (not shown) for providing display light if the display layer 330 is the liquid crystal display layer, but the structure of the display apparatus is not limited as such.

Therefore, because the array substrate 310 consumes less power, the display apparatus 300 of the present embodiment accordingly can have an advantage of consuming less power through utilizing the array substrate 310.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. An array substrate, comprising:
   a substrate;
   a plurality of scan lines disposed on the substrate in a first direction; and a plurality of data lines disposed on the substrate in a second direction, the data lines being electrically insulated and intersected with the scan lines thereby defining a plurality of pixel structures, the first and second directions being mutually perpendicular, and each the pixel structure comprising:
  a first thin film transistor disposed on the substrate and comprising:
    a first gate connected to the corresponding scan line;
    a first source disposed above the first gate and partially overlapping the first gate, one end of the first source being connected to the corresponding data line; and
    a first drain disposed above the first gate and comprising at least one first concavity, and a portion of the first source being disposed in the at least one first concavity;
  a second thin film transistor disposed on the substrate and comprising:
    a second gate connected to the corresponding scan line;
    a second source disposed above the second gate and connected to the first drain, the second source comprising at least one second concavity; and
    a second drain disposed above the second gate and partially overlapping the second gate, and a portion of the second drain being disposed in the at least one second concavity; and
  a pixel electrode connected to the second drain.

2. The array substrate according to claim 1, wherein a gap is formed between the first gate and the second gate.

3. The array substrate according to claim 1, wherein the first gate and the second gate are connected to each other.

4. The array substrate according to claim 1, wherein an opening of the at least one first concavity and an opening of the at least one second concavity face to opposite directions.

5. The array substrate according to claim 1, wherein the first drain comprises a first connecting segment and a plurality of first extending segments extending from the first connecting segment, the first extending segments are opposite to each other, the at least one first concavity is formed between the first connecting segment and the first extending segments, the second source comprises a second connecting segment connected to the first connecting segment and a plurality of second extending segments extending from the second connecting segment, the second extending segments are opposite to each other, and the at least one second concavity is formed between the second connecting segment and the second extending segments.

6. The array substrate according to claim 5, wherein the number of the at least one first concavity and the number of the at least one second concavity respectively are one, and the first drain and the second source are connected with each other to form a H-shaped electrode.

7. The array substrate according to claim 6, wherein each of the first source and the second drain is a strip-shaped electrode.

8. The array substrate according to claim 5, wherein the number of the at least one first concavity is multiple, and the first source comprises a plurality of strip-shaped electrodes.

9. The array substrate according to claim 1, further comprising a first insulation layer and a second insulation layer, the first insulation layer being disposed on the substrate to cover the scan line, the first gate and the second gate, the second insulation later being disposed to cover the data line, the first source, the first drain, the second source and the second drain, wherein the first thin film transistor further comprises a first semiconductor pattern disposed on the first insulation layer and partially overlapping the first gate, the first source and the first drain cover a portion area of the first semiconductor pattern, the second thin film transistor further comprises a second semiconductor pattern disposed on the first insulation layer and partially overlapping the second gate, the second source and the second drain cover a portion area of the second semiconductor pattern.

10. The array substrate according to claim 9, wherein a gap is formed between the first and second semiconductor patterns.

11. The array substrate according to claim 9, wherein the first and second semiconductor patterns are connected to each other.

12. The array substrate according to claim 9, wherein the pixel electrode is disposed on the second insulation layer and connected to the second drain through an opening of the second insulation layer.

13. The array substrate according to claim 9, wherein a portion of the first semiconductor pattern extends to outside of the first gate, the portion of the first semiconductor pattern does not overlap the first gate, a portion of the second semiconductor pattern extends to outside of the second gate, the portion of the second semiconductor pattern does not overlap the second gate.

14. A display apparatus, comprising:
  an array substrate;
  an opposite substrate disposed opposite to the array substrate; and
  a display layer disposed between the array substrate and the opposite substrate;
  wherein the array substrate comprises a substrate, a plurality of scan lines and a plurality of data lines, the scan lines are disposed on the substrate in a first direction, the data lines are disposed on the substrate in a second direction, the data lines are electrically insulated and intersected with the scan lines thereby defining a plurality of pixel structures, the first and second directions are mutually perpendicular, and each pixel structure comprises a first thin film transistor and a pixel electrode, the first thin film transistor is disposed on the substrate and comprises a first gate, a first source and a first drain, the first gate is connected to the corresponding scan line, the first source is disposed above the first gate and partially overlapping the first gate, one end of the first source is connected to the corresponding data line, the first drain is disposed above the first gate and comprises at least one first concavity, and a portion of the first source is disposed in the at least one first concavity, the second thin film transistor is disposed on the substrate and comprises a second gate, a second source and a second drain, the second gate is connected to the corresponding scan line, the second source is disposed above the second gate and connected to the first drain, the second source comprises at least one second concavity, the second drain is disposed above the second gate and partially overlapping the second gate, and a portion of the second drain is disposed in the at least one second concavity, the pixel electrode is connected to the second drain.

* * * * *